United States Patent [19]

Noguchi et al.

[11] Patent Number: 5,040,044
[45] Date of Patent: Aug. 13, 1991

[54] COMPOUND SEMICONDUCTOR DEVICE AND METHOD FOR SURFACE TREATMENT

[75] Inventors: Masahiro Noguchi; Toshihiko Ibuka, both of Ushiku, Japan

[73] Assignees: Mitsubishi Monsanto Chemical Company; Mitsubishi Kasei Corporation, both of Tokyo, Japan

[21] Appl. No.: 546,813

[22] Filed: Jun. 20, 1990

[30] Foreign Application Priority Data

Jun. 21, 1989 [JP] Japan .................................. 1-159330

[51] Int. Cl.$^5$ ..................... H01L 29/34; H01L 21/02; B05D 3/14
[52] U.S. Cl. ...................................... 357/52; 357/17; 357/55; 357/72; 427/50; 427/51; 437/235; 437/241; 437/243
[58] Field of Search ..................... 357/52, 55, 72, 17; 427/50, 51; 437/235, 241, 243

[56] References Cited

U.S. PATENT DOCUMENTS 4,916,513  4/1990  Li ............................................. 357/55

Primary Examiner—Edward J. Wojciechowicz
Attorney, Agent, or Firm—Armstrong, Nikaido, Marmelstein, Kubovcik, & Murray

[57] ABSTRACT

According to the present invention, roughness are formed on the surface of III-V group compound semiconductor to prevent total reflection, and SiNx film is formed on rough surface. This makes it possible to increase external quantum efficiency by surface roughness. Further, bond strength is increased because SiNx film is furnished on the roughness. As the result, the detachment of SiNx film is prevented, moisture resistant property is improved, and service life of LED is extended by preventing oxidation.

7 Claims, 6 Drawing Sheets (n=1.82)

COMPOUND SEMICONDUCTOR DEVICE AND METHOD FOR SURFACE TREATMENT

BACKGROUND OF THE INVENTION

The present invention relates to a semiconductor device of the compounds of III–V groups and a method for surface treatment of such compounds.

As LED for high luminance light emission consisting of AlGaAs semiconductor, LED of single hetero junction structure or double hetero junction structure has been conventionally used which has higher carrier injection efficiency, higher output and higher response speed than the homo-junction structure LED.

These hetero-junction structure LEDs are characterized in that $Al_xGa_{1-x}As$ having high AlAs mixed crystal ratio is used on the light emitted side. For example, in the epitaxial growth of the substrate for red light emitting high luminance LED, Zn-doped $Al_{0.75}Ga_{0.25}As$ layer is formed by 200 $\mu$m (p-type) on p-type GaAs substrate [(100) surface] as p-clad layer by liquid growth method. Then, Zn-doped $Al_{0.35}Ga_{0.65}As$ layer is formed by 2–3 $\mu$m (p-type) as p-active layer. Further, Te-doped $Al_{0.75}Ga_{0.25}As$ layer is formed by about 50 $\mu$m as n-clad layer. Using GaAs substrate selective etchant, optical absorption GaAs substrate is removed to obtain high luminance LED chip. The mixed crystal ratio of chip surface is as high as 0.75. $Al_xGa_{1-x}As$ layer with such high AlAs mixed crystal ratio is very easily oxidized. This results in easy deterioration of light emitting characteristics and the shorter service life of the element. The same applies to the resin-sealed element.

To overcome this problem, a method to form SiNx film has been proposed.

Also, it has been proposed to provide surface roughness in order to increase the external quantum efficiency by preventing total reflection on the surface.

In the past, however, it has been customary only either to provide the surface roughness or to form SiNx film. When only the surface roughness are provided, there arise the problems of moisture resistance and shorter service life of the element due to surface oxidation. When only SiNx film is furnished as protective film, bond strength is weak and film is easily detachable.

SUMMARY OF THE INVENTION

The present invention is proposed to solve the above problems.

It is an object of the present invention to increase external quantum efficiency by preventing total reflection of the compound semiconductor device.

Another object of the invention is to prevent the detachment of film by increasing the bond strength of protective film of compound semiconductor device.

It is still another object of this invention to increase moisture resistance of compound semiconductor device and to extend the service life of the element by preventing oxidation.

To attain these objects, the present invention is characterized in that irregularities are formed on the surface of III–V group compound semiconductor and SiNx film is further formed on the roughness of surface.

Further, this invention proposes a surface treatment method for III–V group compound semiconductor, in which roughness is formed on the surface by physical or chemical method and SiNx film is formed on irregular surface by reduced pressure CVD method, plasma CVD method or sputtering method.

Further, the invention is characterized in that III–V group semiconductor having the mixed crystal ratio of $0 < AlAs < 1$ is used.

The thickness of SiNx film is preferably 20 nm–500 nm.

It is also preferable that the thickness of SiNx film is odd-fold multiple of $\lambda/4n$. ($\lambda$ is wavelength of emitting light, and n is refractive index of SiNx film.)

It is also preferable to use plasma CVD method to form SiNx film of this invention.

DESCRIPTION OF THE PREFERRED EMBODIMENT

Figure 1:
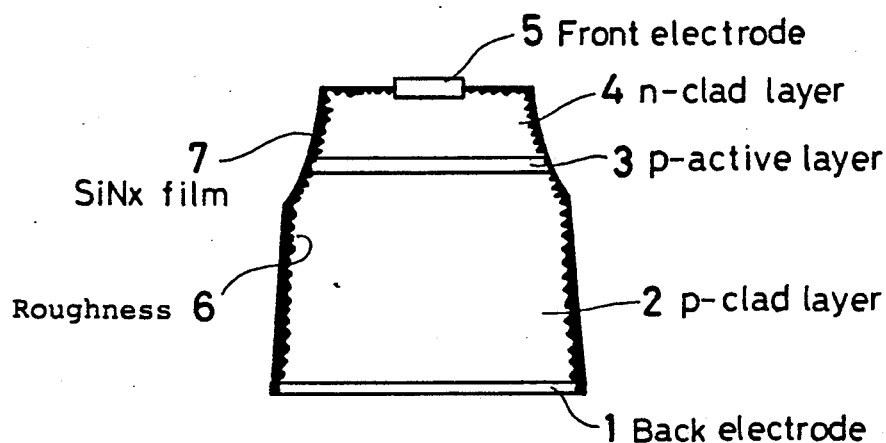
FIG. 1 is a drawing to show an example of structure of LED for high luminance light emission of this invention.

FIG. 1 is a diagram to show an example of structure of LED for hetero junction high luminance light emission according to this invention, where 1 refers to a back side electrode, 2 a p-clad layer, 3 a p-active layer, 4 an n-clad layer, 5 a front electrode, 6 roughness, and 7 SiNx film.

The light emitting diode consisting of AlGaAs semiconductor given in FIG. 1 as an example comprises p-active layer 3 sandwiched by clad layers 2 and 4, and the electrodes 1 and 5 are arranged on front and back side surfaces of it. This is performed by turning the interface with semiconductor to alloy through heat treatment after vacuum-depositing the electrodes. Next, the roughness 6 are formed on the entire surface of LED except the electrodes by physical methods such as sandblast or fine particle blowing, or by chemical methods such as etching. After forming the roughness, SiNx film is formed as protective film on the surface, for example, by plasma CVD method.

Figure 2:
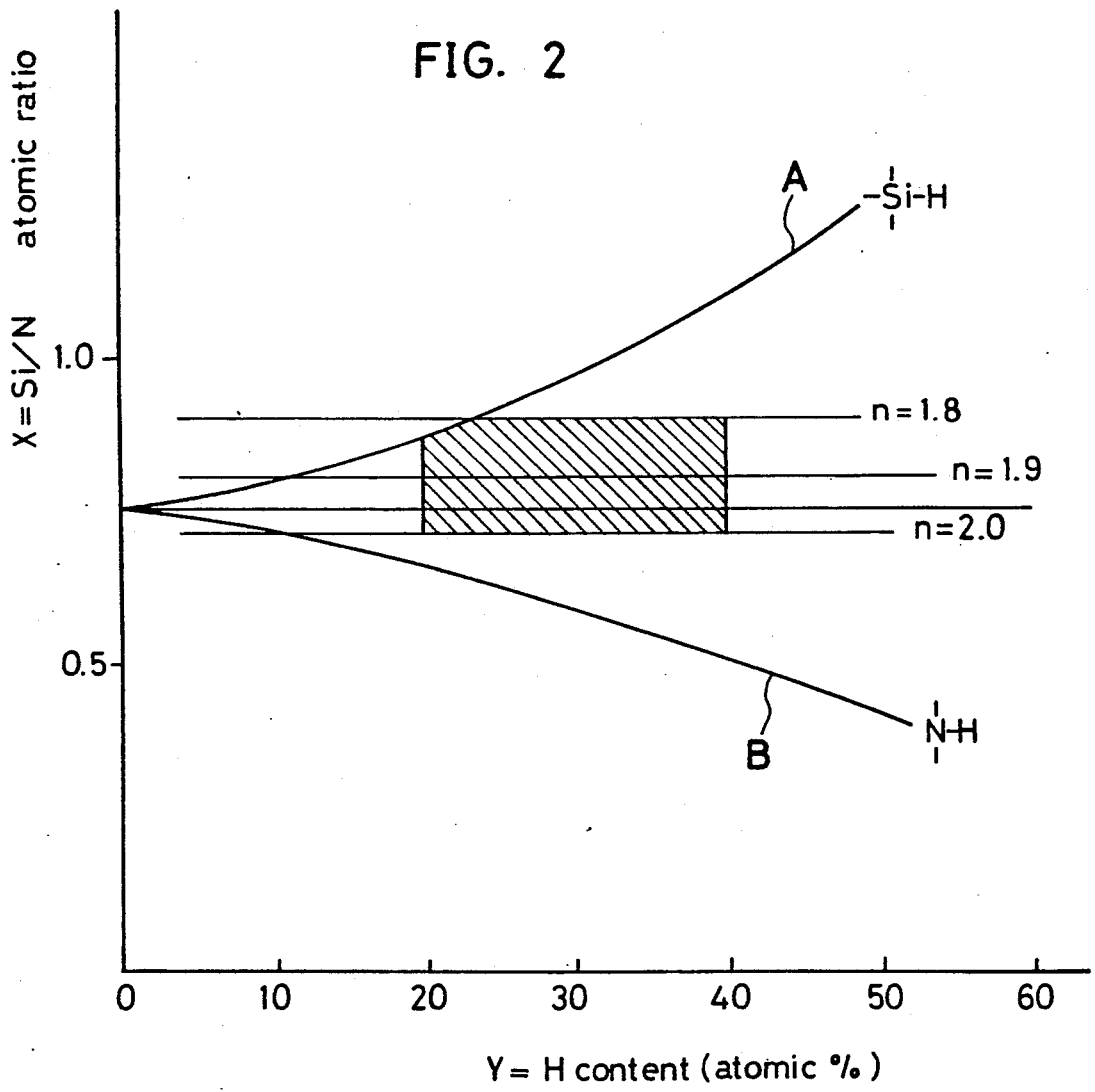
FIG. 2 is a diagram to show the relationship between hydrogen content and silicon/nitrogen ratio of the protective film.

As SiNx film, for example, the film having the hydrogen content (atomic ratio) and silicon/nitrogen ratio (atomic ratio) as shown in the shaded portion of FIG. 2 can be used. The curve A of FIG. 2 represents the case where all of hydrogen atoms in SiNx are bonded with silicon, and the curve B shows the case where all hydrogen atoms in SiNx are bonded with nitrogen. Normally, SiNx is between these curves A and B. Because of the characteristics as protective film, it is preferable to select the hydrogen content in such manner as to have the atomic ratio of about 20-40% and refractive index of 1.8-2.0 and to provide the protective film with the components as given in the shaded portion of the figure, while the present invention is not limited to this.

Figure 3:
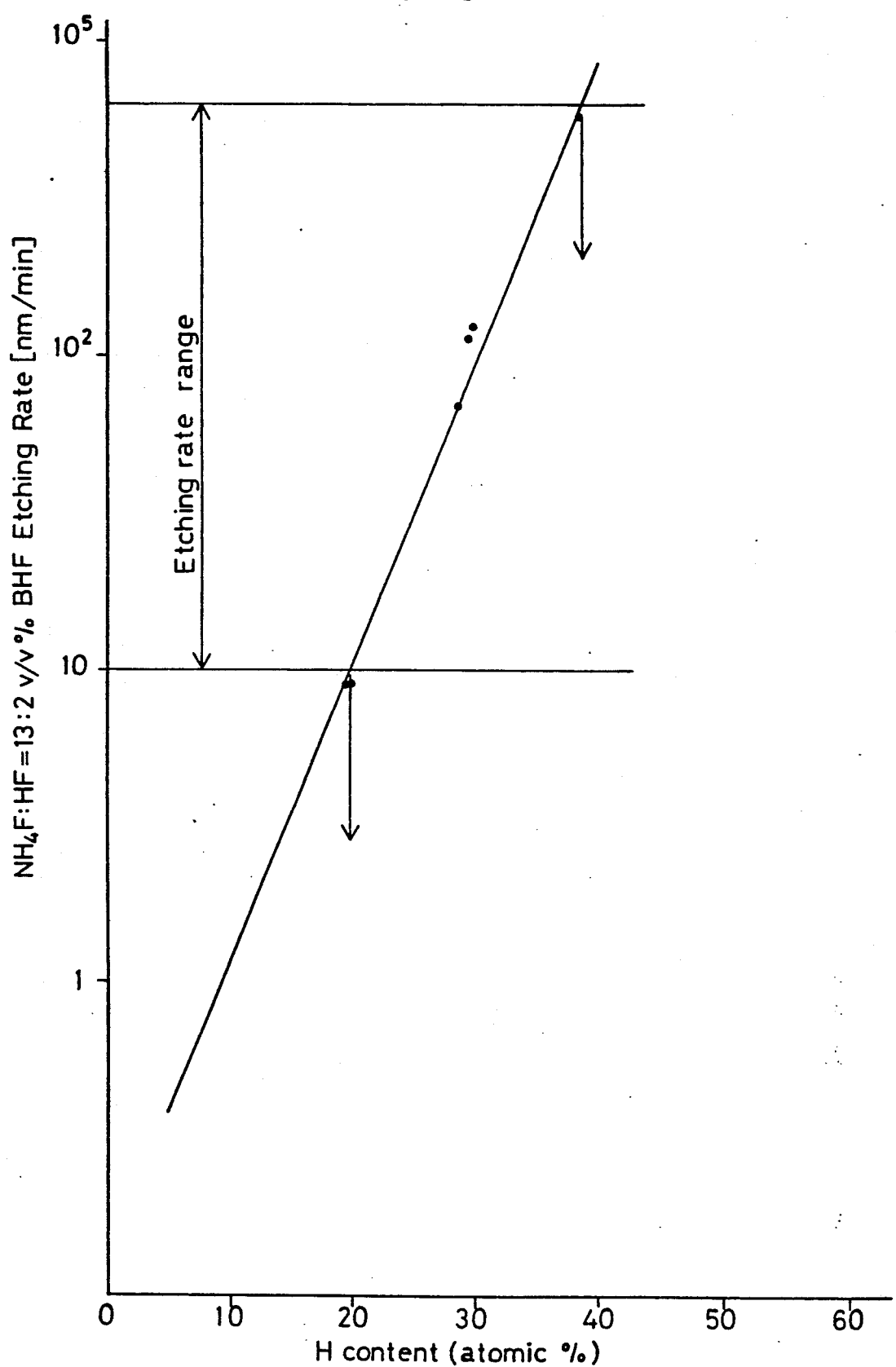
FIG. 3 is a diagram for the relationship between hydrogen content and etching speed.

As shown in FIG. 3, hydrogen content in SiNx is obtained by the etching speed when etching is performed at the temperature of 25° C. using the etching solution with the ratio of ammonium fluoride (NH4F) and hydrofluoric acid of 13:2. Namely, protective film has perfect function if it is within the etching speed range of 10-600 nm/min. when film thickness is measured by ellipsometer.

Figure 4:
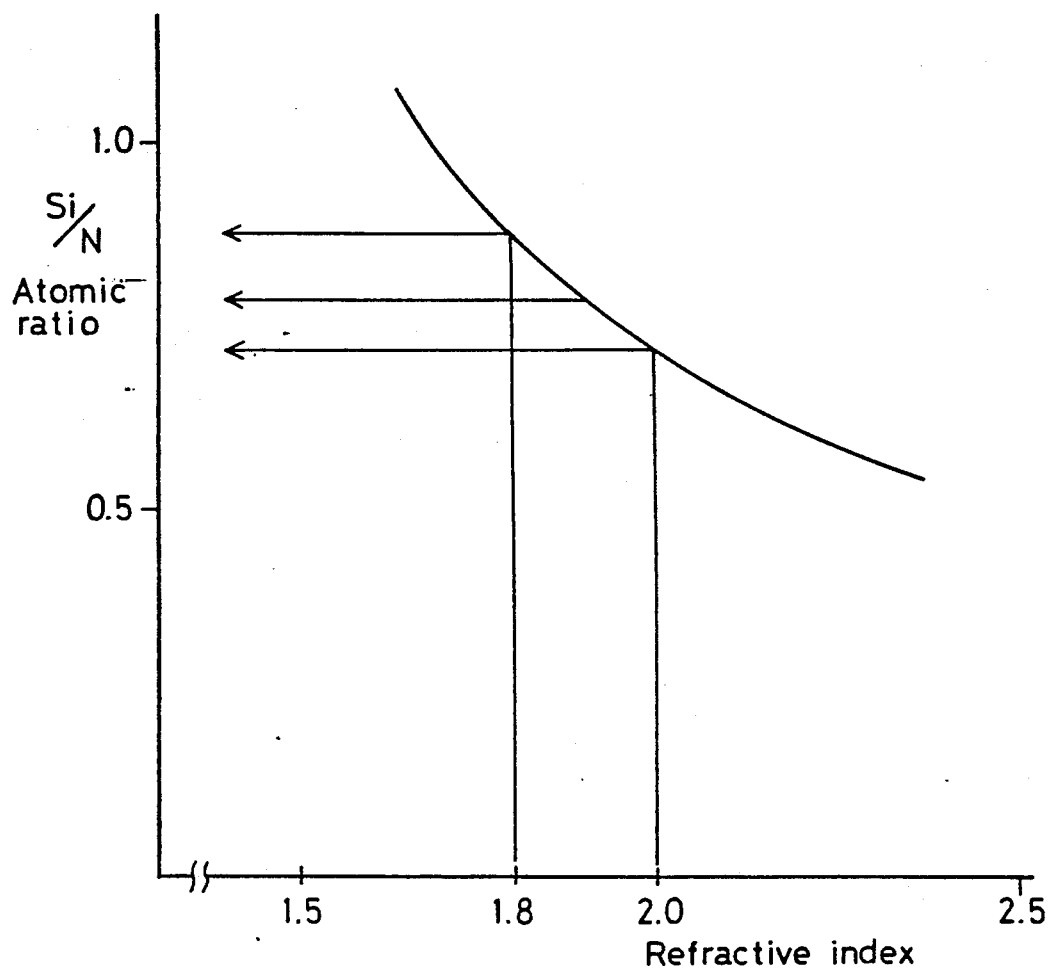
FIG. 4 shows the relationship between refractive index and silicon/nitrogen ratio.

The relation between the refractive index of protective film and nitrogen/silicon ratio is as given in FIG. 4. By selecting the atomic ratio of silicon and nitrogen, it is possible to have the refractive index at 1.8-2.0.

If film thickness is too thin, it cannot provide perfect function as protective film, whereas, if it is too thick, much time is required for film manufacture and there is also the possibility of detachment due to the stress of the film itself. The thickness of about 20-500 nm would be adequate.

As the method to form SiNx film, plasma CVD method is the most preferable. In addition, there are the methods such as reduced pressure CVD method, sputtering method, etc. For example, there is thermal decomposition CVD method, by which $Si_3N_4$ is deposited on substrate through thermal decomposition reaction by introducing silane $SiH_4$ and ammonium $NH_3$ into chamber. By this method, it is possible to obtain the film, which is closer to stoichiometric film (with Si/N ratio of 3:4) and has lower hydrogen content. It is advantageous in that the etching rate can be decreased and hard film is produced. In this case, the temperature of 600° C. or more is required for the film manufacture.

In the reactive sputtering method, Si is processed by sputtering through discharge in an atmosphere (Pressure: $1 \times 10^{-2}$ Torr to 1 Torr), which is produced by mixing small quantity of $N_2$ to argon with Si as target, and SiNx is deposited on substrate. This method can be used for compound semiconductor because there is no need to heat the substrate, while special care should be taken for stoichiometric control and stress control in film.

Figure 5:
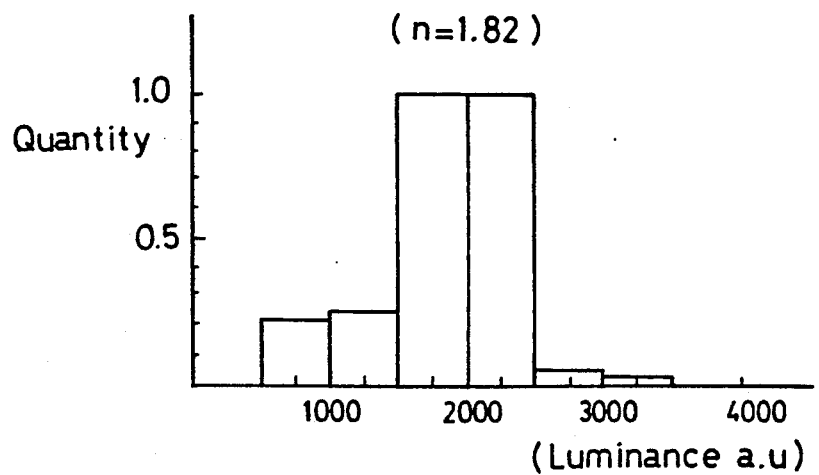
FIG. 5 is a diagram of luminance histogram of LED according to this invention.
Figure 6:
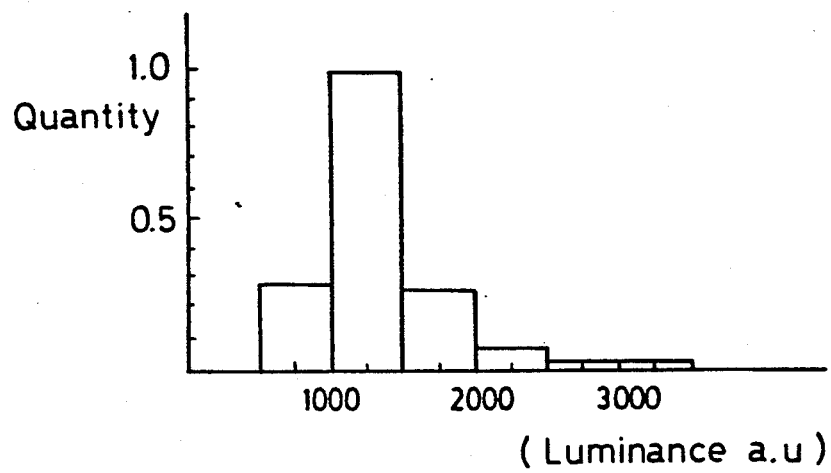
FIG. 6 is a luminance histogram of conventional type LED.

In the light emitting diode, for which the atomic ratio of silicon and nitrogen is set to have refractive index at 1.82 and the protective film with thickness of 270 nm (intraplanar hemogeneity ±5%) is formed, luminance histogram was obtained to the light with luminescent wavelength of 660 nm, and the results as given in FIG. 5 were obtained. When measurement was made in the case where only roughness was provided or only SiNx film was formed, the results were as shown in FIG. 6. In the figures, luminance is taken on abscissa (in any unit) and the quantity on ordinate (standardized at maximum for comparison purpose).

Average luminance of 1929 was obtained in the product according to the present invention while it was 1373 in the conventional type product, and luminance can be apparently improved by this invention.

Next, life tests have been performed for 3 cases: LED provided with SiNx film only, LED furnished with roughness on surface, and LED according to the present invention. The results are summarized in Table 1.

TABLE 1

|        | SiNx film only | Surface irregularities only | Present invention |
|--------|----------------|------------------------------|-------------------|
| Test A | 81.8%          | 82.8%                        | 96.7%             |
| Test B | 78.1%          | 76.7%                        | 93.6%             |

In the table, Test A is a test where Step 1 and Step 2 are repeated by 3 times each. (Step 1: Driven for 12 hours with the driving current of 20 mA DC at 85° C. and relative humidity of 95%; Step 2: Driven for 12 hours with the driving current of 20 Ma DC at −20° C. and relative humidity of 100%) Test B is a test where, after performing Test A, Step 3 and Step 4 are repeated by 30 times each. (Step 3: Driven for 4 hours with the driving current at 20 mA DC at 85° C. and relative humidity of 95%. Step 4: Driven for 4 hours with the driving current of 20 mA DC at −20° C. and relative humidity of 100%.) Numerical figures in the table indicate the luminance residual ratio (ratio to the value at initial measurement).

As it is evident from Table 1, the product according to this invention has higher luminance residual ratio and service life is considerably extended.

If the roughness is larger, light is scattered more, and there is no restriction because it is enough if bond strength of SiNx film can be maintained. Preferably, the bottom-to-bottom distance or peak-to-peak distance of roughness is 0.1 $\mu$m or more.

Figure 7:
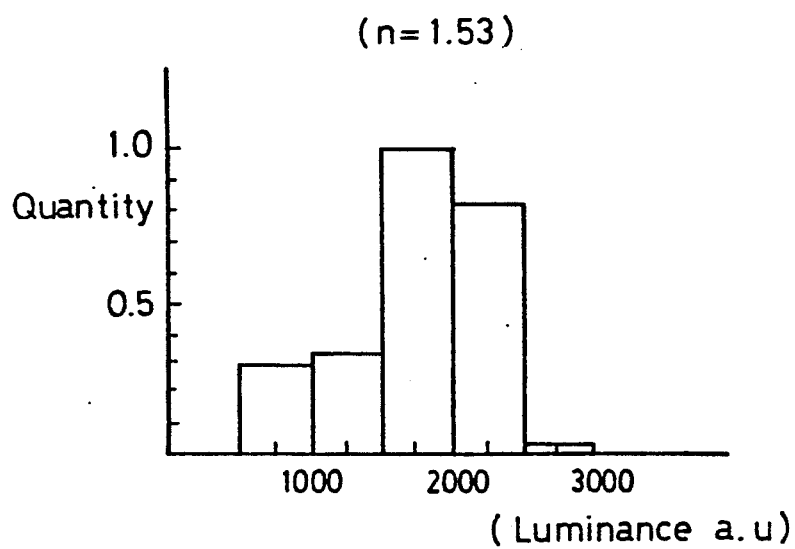
FIG. 7 and FIG. 8 are diagrams to show luminance histogram of LED when refractive index is changed.
Figure 8:
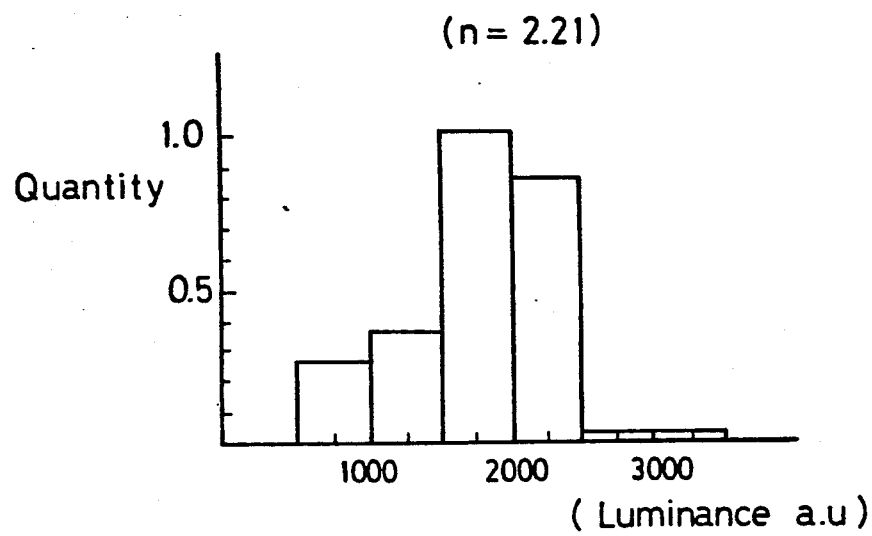

By the similar procedure as in the case of FIG. 5, atomic ratio of Si/Ni was set to have the refractive index of 1.53 and 2.21 and the protective film with thickness of 270 nm (intraplanar homogeneity ±5%) was formed. In this light emitting diode, luminance histogram was obtained to the light with luminance wavelength of 660 nm, and the results were obtained as given in FIG. 7 and FIG. 8. Average luminance in case refractive index was 1.53 was 1754, and it was 1758 in case the refractive index was 2.21.

Figure 9:
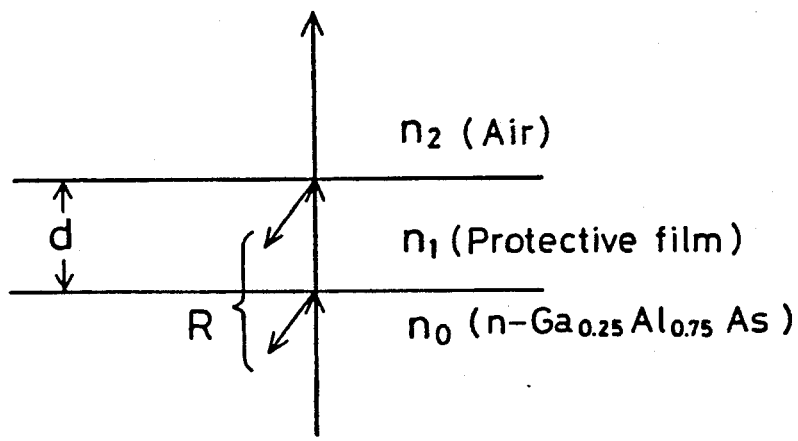
FIG. 9 is an explanatory diagram to calculate reflectance.

Next, description will be given on the refractive index and thickness of protective film and the reflectance in connection with FIG. 9.

Suppose that the refractive index of $n\text{-}Al_{0.75}Ga_{0.25}As$ layer, protective film and the air is $n_0$, $n_1$ and $n_2$ respectively, $$n_1 \cdot d = \frac{\lambda}{2\pi} \cdot \frac{\pi}{2} \times \text{(odd number)}$$

$$= \frac{\lambda}{4} \times \text{(odd number)}$$

When $n_0 = 3.3$ and $n_2 = 1.0$, and $$n_1 = \sqrt{n_0 n_2} = 1.82, d \approx 90 \text{ nm} \times \text{odd number}$$

Figure 10:
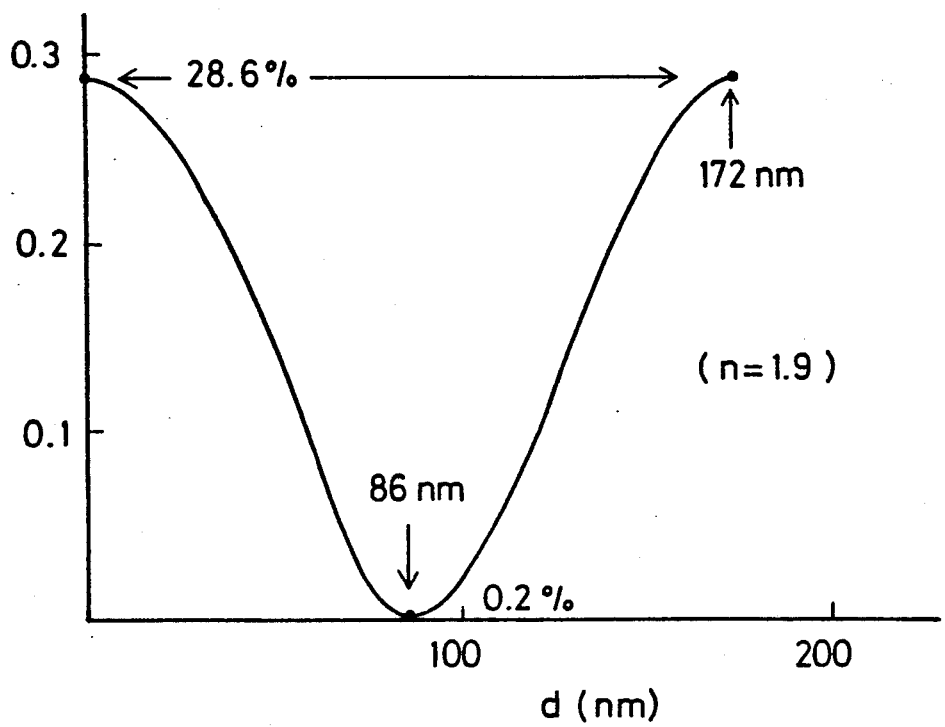
FIG. 10 is a diagram to show the relationship between film thickness and reflectance.

When the change of reflectance to vertical direction in relation to film thickness d is obtained when refractive index is 1.9, utilizing the above relationship, the result is as given in FIG. 10.

It is evident from the figure that, when film thickness is odd-fold multiple of 86 nm, reflectance is 0.2%, and high output characteristics can be achieved with the reflectance of this order. If refractive index is within the range of 1.80-2.0, this condition can be satisfied.

EMBODIMENT 1

After the electrodes were vacuum-deposited, alloy electrodes were prepared through heat treatment. After this AlGaAs-LED wafer was immersed in the mixture solution containing hydrogen peroxide water and ammonium (1:1) for one minute, it was washed with water for 30 seconds. This was further immersed in 3% HCl aqueous solution for etching. Then, it was washed with water for 15 minutes, neutralized with methyl alcohol and dried. On the wafer surface with roughness thus formed, SiNx film was deposited by plasma CVD method. As the condition to prepare the film, gas flow rate was set to $SiH_4$ (20%/$N_2$), and diluted solution of 14 sccm ($cm^3$/min.; at 0° C.; 1 atmospheric pressure), ammonium ($NH_3$) of 60 sccm, and nitrogen of 11 sccm were used. With full pressure of $5 \times 10^{-2}$ Torr, substrate temperature at 280° C. and RF power at 50W, film was formed by plasma CVD method with film preparation time of 28 min. As the result, the film with thickness of about 27o nm and refractive index of 1.9 was obtained. By processing the roughness, external quantum efficiency was improved by about 40%. Because SiNx film was formed, no decrease of luminance was noted in the life test for 300 hours.

COMPARATIVE EXAMPLE

Figure 11:
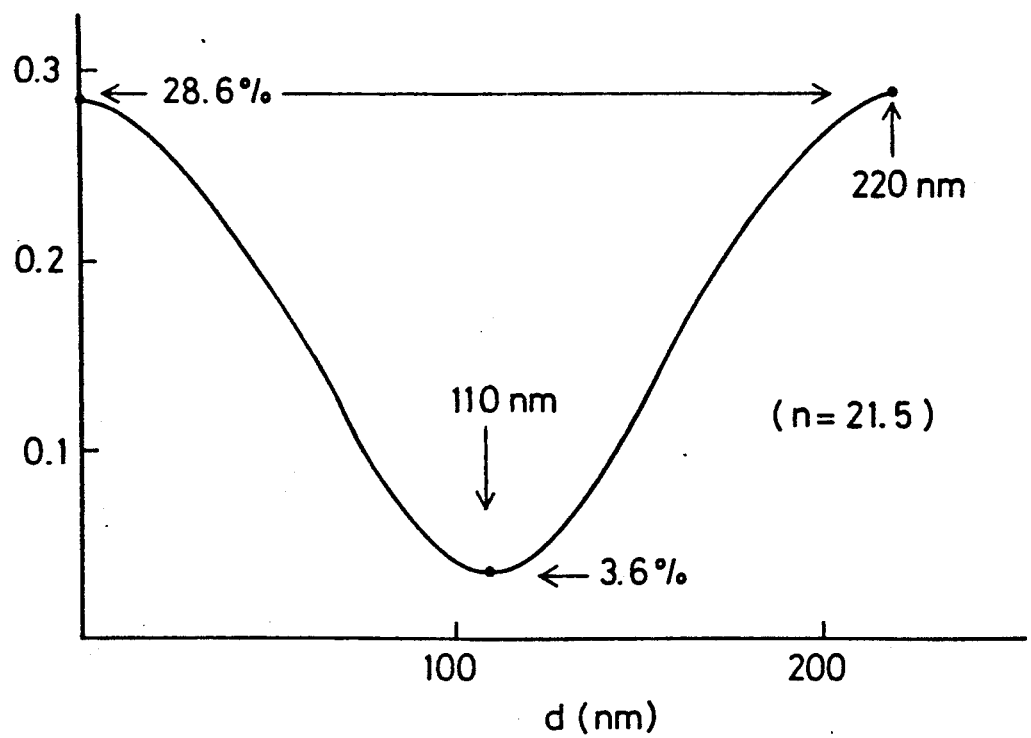
FIG. 11 is a diagram to show the relationship between film thickness of silicon oxide and reflectance.

In case silicon oxide film ($SiO_2$) was used as protective film, the change of reflectance in relation to film thickness d is as shown in FIG. 11 when $n_1 = 1.5$.

As it is evident from the figure, reflectance reaches minimum when film thickness is 110 nm. It is still 3.6%, and it is apparent that high luminance output cannot be obtained.

As described above, it is possible by the present invention to increase the light takeoff efficiency by processing the roughness on III-V group compound semiconductor surface and to increase the bond strength of the film itself by forming SiNx film on the irregular surface. This makes it possible to prevent the detachment of SiNx film, to extensively improve moisture resistance property and to extend service life because the deterioration of LED chips due to oxidation of AlGaAs is reduced. Using SiNx film as protective film, moisture resistance property is extensively increased compared with the other passivation film such as natural oxidation film, silicon oxide film, etc. Service life is extended, and light emitting output can be increased by about 25%.

We claim:
1. A compound semiconductor device, comprising:
   back and front electrodes;
   a p-active layer;
   p-clad and n-clad layers sandwiching said p-active layer, all peripheral surfaces of said p-active layer and said p-clad and n-clad layers, except for the attachment of the p-clad layer to the back electrode, having irregular surfaces;
   a film coating each of said irregular surfaces, said film being composed of an SiNx compound, said SiNx compound being selected from any one of those SiNx compounds having refractive index in a range from 1.8 to 2.0, said film improving luminant output from a front surface of said n-clad layer and protecting said irregular surfaces by preventing oxidation thereof.

2. A compound semiconductor device according to claim 1, wherein III-V group compound semiconductor is AlGaAs semiconductor having mixed crystal ratio of $0 < AlAs < 1$.

3. A compound semiconductor device according to claim 2, wherein SiNx film has thickness of 20 to 500 nm.

4. A compound semiconductor device according to claim 2, wherein the film thickness of SiNx film is odd-fold multiple of $\lambda/4n$ ($\lambda$ is wavelength of emission light, and n is refractive index of SiNx film).

5. A compound semiconductor device according to claim 2, wherein SiNx film is formed by plasma CVD method.

6. A surface treatment method of a Group III-V compound semiconductor, comprising the steps of:
   forming roughness on a surface of the semiconductor by one of a physical method and chemical method, and
   forming an SiNx film on the roughened said surface by one of a reduced pressure continuous vapor deposition, a plasma continuous vapor deposition, and a sputtering method; said SiNx compound being selected from any one of those SiNx compounds having a refractive index in a range from 1.8 to 2.0.

7. A surface treatment method according to claim 6, wherein III-V group compound semiconductor is AlGaAs semiconductor having mixed crystal ratio of $0 < AlAs < 1$.

* * * * *